United States Patent [19]

Hoefi

[11] 3,875,522

[45] Apr. 1, 1975

[54] INTEGRATED DIRECT-COUPLED ELECTRONIC ATTENUATOR

[75] Inventor: Werner H. Hoefi, San Jose, Calif.

[73] Assignee: Signetics Corporation, Sunnyvale, Calif.

[22] Filed: Apr. 13, 1973

[21] Appl. No.: 351,030

[52] U.S. Cl. .................... 330/30 D, 330/69, 330/24
[51] Int. Cl. .................... H03f 3/68
[58] Field of Search .................... 330/30 D

[56] References Cited

UNITED STATES PATENTS

| | | | |
|---|---|---|---|
| 3,573,496 | 4/1971 | Lake, Jr. et al. | 330/30 D X |
| 3,617,855 | 11/1971 | Hisatsu | 330/69 X |
| 3,727,146 | 4/1973 | Hughes | 330/30 D X |
| 3,737,797 | 6/1973 | Amemiya | 330/30 D |
| 3,760,197 | 9/1973 | Dann | 330/30 D X |
| 3,783,307 | 1/1974 | Breuer | 330/30 D X |

*Primary Examiner*—Nathan Kaufman
*Attorney, Agent, or Firm*—Flehr, Hohbach, Test, Albritton & Herbert

[57] ABSTRACT

An integrated direct coupled electronic attenuator circuit provides both attenuation and switching between attenuation limits of 0 and 100 percent. Zero dc offset voltage is provided with the use of a pair of differential amplifiers driven by a common current source. Switching means are provided for controlling the partitioning of such current between the differential amplifier. Loads are coupled to the other side of the differential amplifiers to receive the current from the constant current source.

4 Claims, 5 Drawing Figures

INTEGRATED DIRECT-COUPLED ELECTRONIC ATTENUATOR

BACKGROUND OF THE INVENTION

The present invention is directed to a direct coupled integrated electronic attenuator circuit and more specifically to both an attenuator and a switching circuit which are especially suitable for use in an integrated quadraphonic sound decoder.

A system for decoding four channel signals on a recorded disk is disclosed in Takahashi U.S. Pat. No. 3,686,471. Since such decoder circuit would be used in conjunction with, for example, the amplifier of a home sound reproduction apparatus it is desirable to manufacture such decoders in totally integrated format. In order to provide a reasonably inexpensive and simple integrated circuit such circuit must be direct coupled. A serious problem with direct coupled circuits is, of course, dc offset voltages. This is especially undesirable in an audio sound circuit since dc offset voltages are heard as clicks at the audio output or speakers.

OBJECT AND SUMMARY OF THE INVENTION

It is, therefore, an object of the present invention to provide an electronic attenuator circuit which is in integrated format, direct coupled, but yet has no dc offset voltage.

In accordance with the above object there is provided an integrated direct coupled electronic attenuator with first and second differential amplifiers. Each amplifier includes a pair of transistors with each transistor having an input control terminal and first and second output terminals. The first output terminal of each pair of transistors is tied together with at least one of the input control terminals receiving an ac input signal. There is provided a common constant current source. First and second switching means couple the constant current source to the tied pairs of the first output terminals. The switching means include means for controlling the partitioning of the constant current between the first and second differential amplifiers. Load means are coupled to the second output terminals of the differential amplifiers for receiving current from the constant current source.

DETAILED DESCRIPTION OF THE PREFERRED EMBODIMENT

Figure 1:
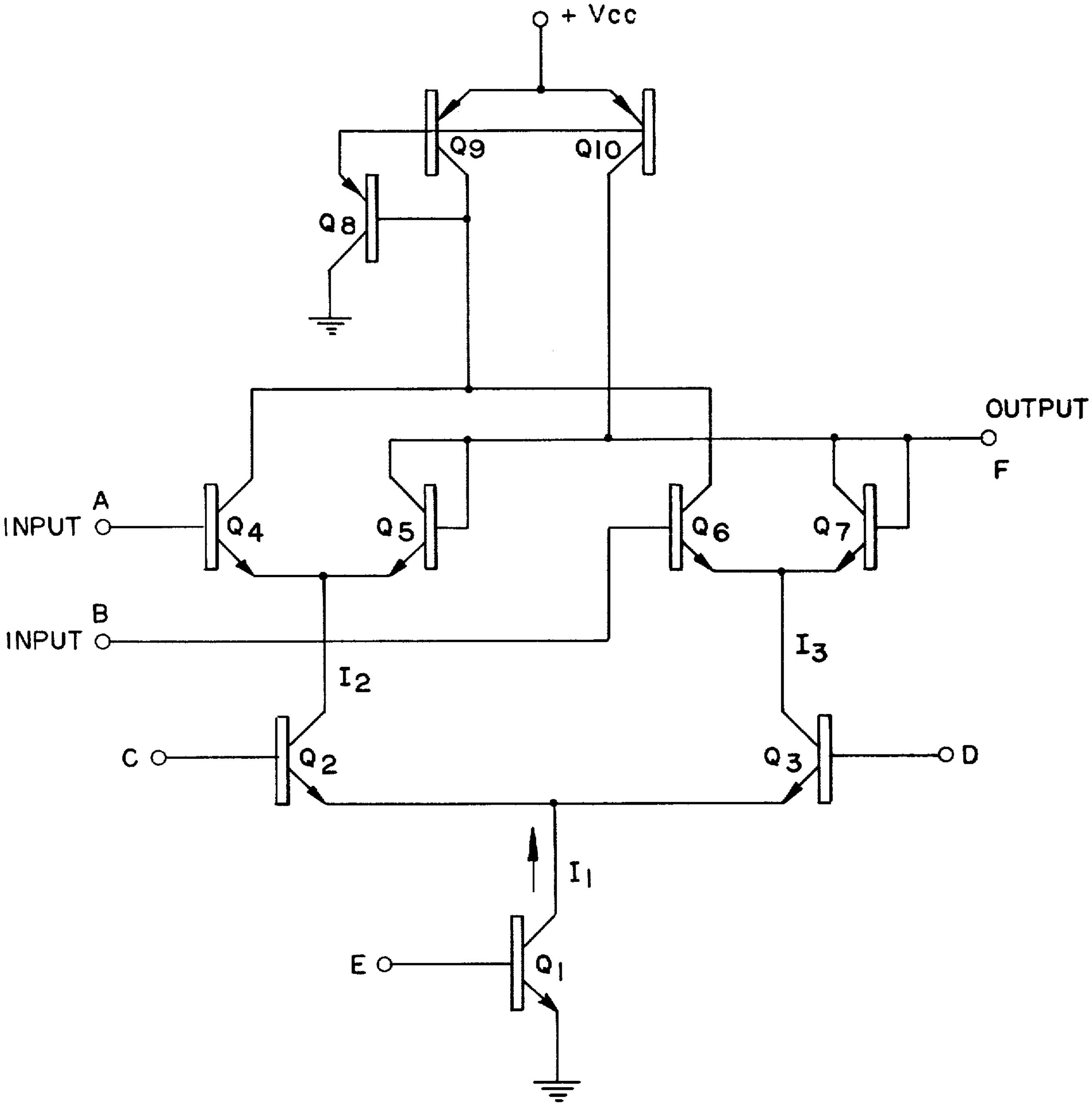
FIG. 1 is a circuit schematic of one embodiment of the invention.

Referring to FIG. 1, first and second differential amplifiers, Q4, Q5 and Q6 and Q7 are shown. Input control terminal A is coupled to the base of Q4 and input terminal B to the base of Q6. The emitter terminals of Q4 and Q5 are tied together as are the emitter terminals of Q6 and Q7. These tied terminals are in turn coupled respectively to the collectors of transistors Q2 and Q3. The emitters of Q2 and Q3 are tied together and to a common constant current source Q1 which provides the current $I_1$. Bias on the input terminal E sets the amount of current $I_1$. This is divided or partitioned between the differential amplifiers Q4, Q5 and Q6, Q7. Q2 and Q3 are switched by their inputs C and D.

A common load is provided by means of transistors Q8, Q9 and Q10. The emitters of Q9 and Q10 are coupled together and to a $+V_{cc}$ voltage source. The collector of Q9 is coupled to the tied collectors of Q4 and Q6 and the collector of Q10 to the tied collectors of Q5 and Q7. Transistor Q8 is coupled to transistor Q9 in a current multiplier configuration so that a change on the base input to Q8 will be amplified and produce a change on the base input of Q9 which is also the base input of Q10.

The reference voltage for the differential amplifiers Q4, Q5 and Q6, Q7 is provided via inputs A and B. The base to collector connections of Q5 and Q7 will have the same dc potential as A and B.

In general, the configuration of FIG. 1 is ideal for an integrated switching circuit since the transistors are processed identically and are in close proximity to each other. This provides close matching of the transistor $V_{be}$ and gain parameters. Also by use of the differential amplifier configuration there is no need for large value resistors. Moreover, the foregoing construction also provides good temperature compensation.

In operation, the attenuator of FIG. 1 normally operates as a 100 percent attenuator or in effect an on-off switch. In other words, the attenuator is operated only at its two extremes. For zero attenuation between the input A and the output F, which is coupled to the tied collectors of Q5 and Q7, the input "D" is below the dc potential of the input "C." In this state all of the current of Q1 will flow through Q2 and activate the differential amplifier Q4, Q5. Thus, the ac input signal on input A will be directly transmitted without attenuation to the output terminal F. By reversing the polarity between C and D inputs the differential amplifier Q6, Q7 will be activated providing for 100 percent attenuation with respect to input A but zero attenuation with respect to input B.

The maximum differential swing between inputs A and B is limited by the reverse breakdown voltage of the base emitter junction plus one diode junction. High differential voltages can be achieved by adding additional diode junctions between the emitters of Q4, Q5 and Q6, Q7. If desired, shaping networks may be inserted between the emitters of Q2 and Q3 to provide a somewhat different switching characteristic.

Figure 2:
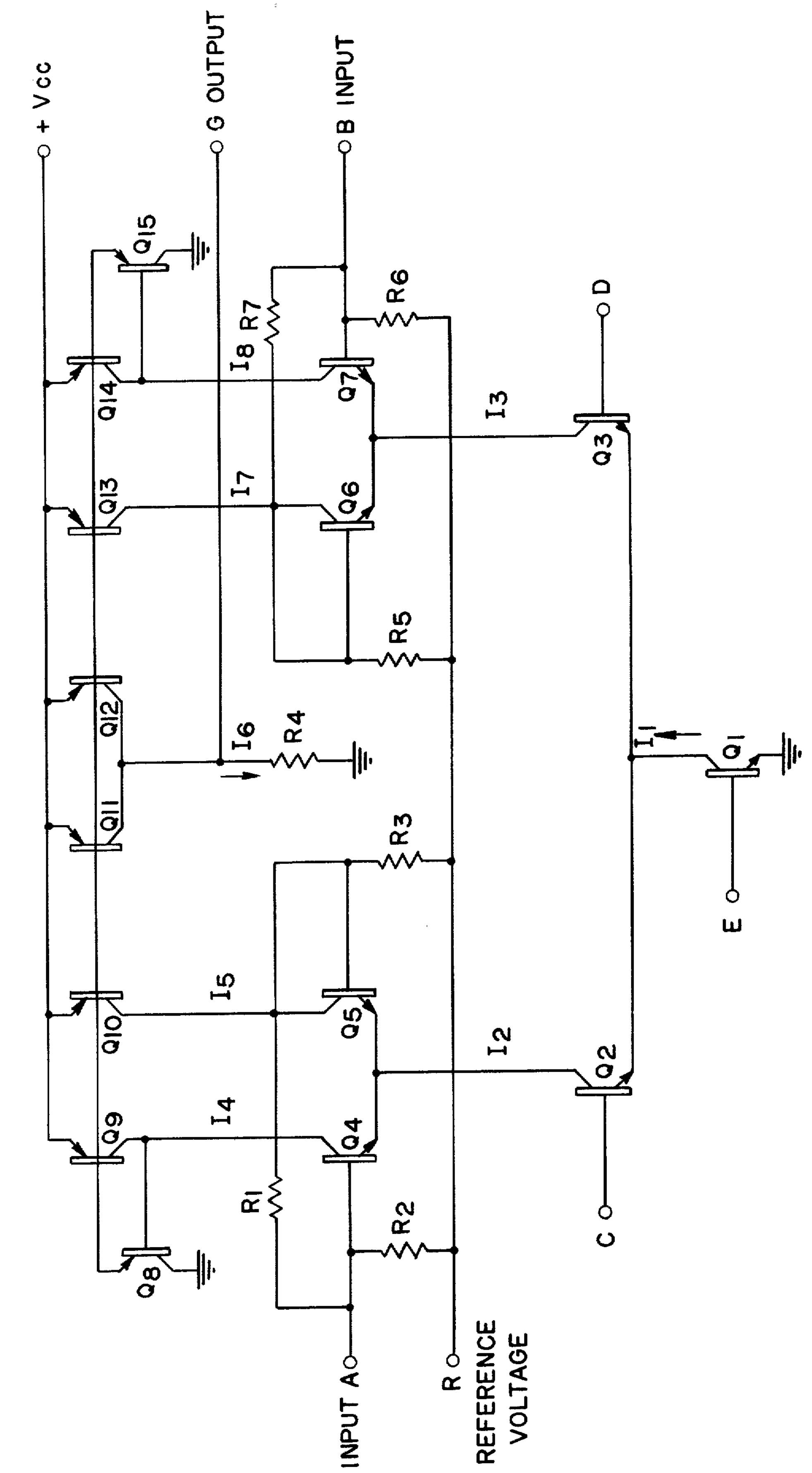
FIG. 2 is a circuit schematic of another embodiment of the invention.

Thus, the circuit of FIG. 1 provides for an output voltage which maintains the same dc potential as the input signal. Applications of the device include use as an analog switch, multiplexing of audio signals and in a muting circuit which will be described in detail in conjunction with FIG. 3.

Where the circuit of FIG. 1 is desired to be used as a variable attenuator which is linear and has low distortion the circuit of FIG. 2 which is a modification of FIG. 1 should be utilized.

The circuit of FIG. 2 differs from FIG. 1 in that separate loads are provided for each differential amplifier pair, Q4, Q5 and Q6 and Q7. These are respectively the transistors Q8, Q9, Q10 and Q13, Q14, Q15. Moreover, these loads are connected in a current mirror configuration where in effect the currents I4 and I5 from differential amplifier Q4, Q5 and currents I7 and I8 from differential amplifier Q6, Q7 are "turned around" at the source of dc potential $V_{cc}$ by the transistors Q11 and Q12 and summed in resistor R4. This is indicated as current I6 and is the sum of the collector currents of Q4 through Q7. This is achieved by connecting all of the bases of the transistor pairs Q9 through Q14.

A separate reference voltage R is applied to Q5 and Q6 through resistors R3 and R5. Resistors R2 and R6 are bias resistors between the reference voltage and the bases of Q4 and Q7 which also are input terminals A and B. Lastly, resistors R1 and R7 provide a common mode voltage for increase in signal handling.

In operation, the amount of attenuation is given by the ratio of I2 and I3. This ratio is controlled by the inputs C and D to Q2 and Q3 which in turn controls the partitioning of the current I1 between I2 and I3. Thus, for example, assuming the C input is high and the D input low, the differential amplifier Q4, Q5 would apply full or unity gain to input A; thus an ac input signal on input A is produced at the G output terminal with zero attenuation. On the other hand, with the opposite conditions on terminals C and D there would be 100 percent attenuation or zero gain.

The device of FIG. 2 includes uses such as in analog control circuits, level controls, tone controls, balance controls, AM modulators, and feedback amplifier controls. For example, when used as a balance control between two microphones, they would be connected between input A and input B; the levels on inputs C and D would control the amount of respective microphone signals which are mixed together to produce the final output signal on output G. Again, as in FIG. 1 the configuration of the circuit of FIG. 2 provides attenuation of analog signals with no dc shift or offset at the output. In addition, as in FIG. 1 proper shaping circuits may be inserted between the emitters of Q2 and Q3.

Figure 3:
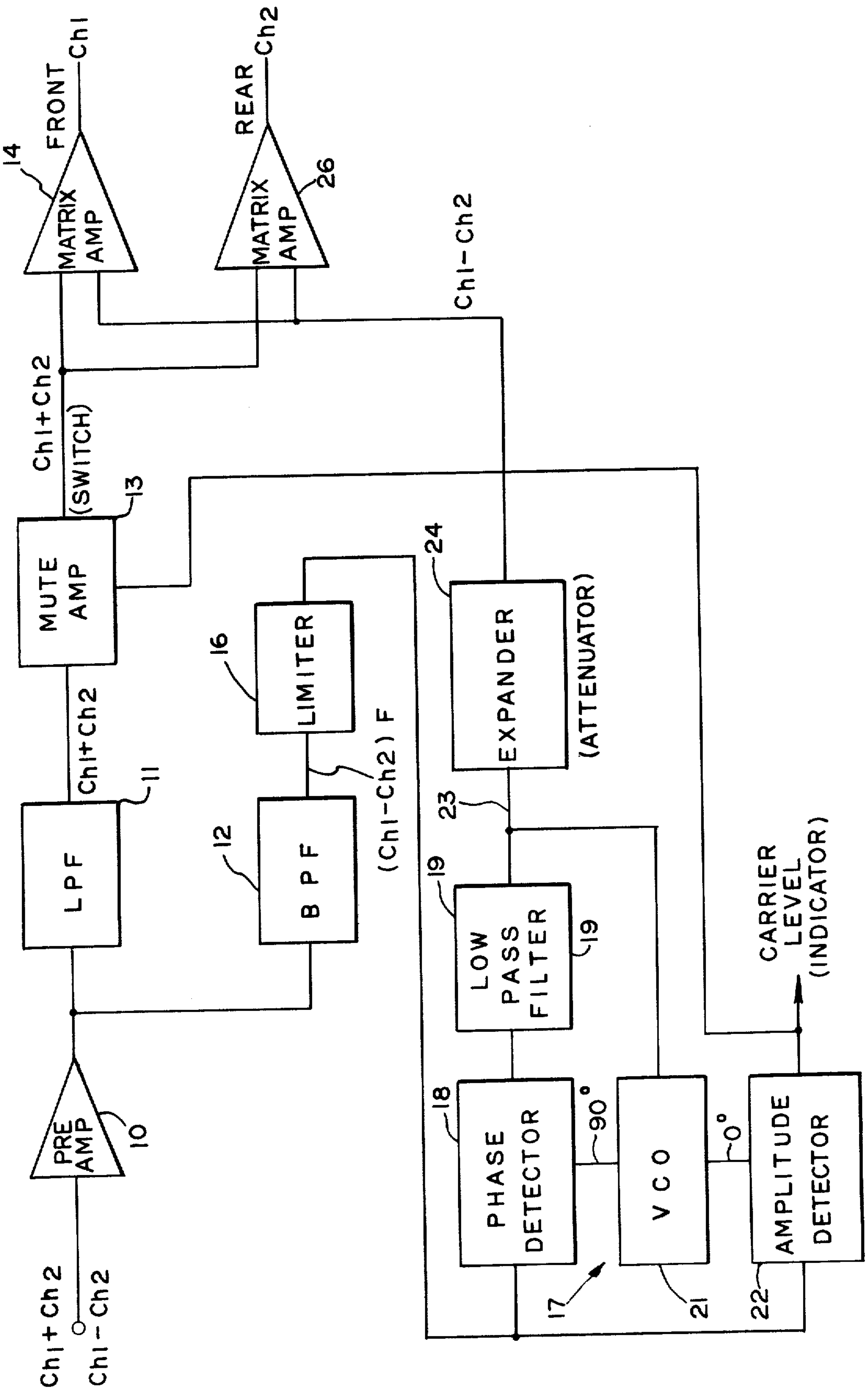
FIG. 3 is a block diagram illustrating the preferred usages of FIGS. 1 and 2.

FIG. 3 illustrates a quadraphonic decoder such as that shown in the Takahashi patent. FIG. 3 represents merely one channel of a decoder which would, for example, decode the multiplex signal reproduced from one wall of a record groove. As illustrated, this would consist of a sum signal Ch1 + Ch2 and a frequency modulated difference signal F (Ch1 − Ch2). The signals are preamplified at preamplifier 10 and then separated into two components by a low pass filter 11 and a bandpass filter 12. The Ch1 + Ch2 output of low pass filter 11 is passed through a mute amplifier 13 and coupled to a matrix amplifier 14. The output of bandpass filter 12 is coupled to a limiter 16 and then to a demodulator 17 which is in the form of a typical phase locked loop. Such loop includes a phase detector 18, low pass filter 19, and a voltage controlled oscillator 21. In order to sense the presence of a frequency modulated signal a quadrature signal amplitude detector 22 is utilized which indicates whether a Ch1 − Ch2 signal is present. The output of amplitude detector 22 is coupled to muting amplifier 13 to switch the amplifier on or off depending on whether a signal is present. The output of the phase locked loop occurs on line 23 and is coupled to an expander 24 and then to a matrix amplifier 26. By matrixing the Ch1 + Ch2 and Ch1 − Ch2 separate signals Ch1 and Ch2 signals are produced which will be coupled to the front and rear speakers of a stereo quadraphonic sound system.

The switching circuit of FIG. 1 is used as a mute amplifier 13 of FIG. 3. The output of amplitude detector 22 is coupled to the C input terminal of FIG. 1 and the input A is the output of low pass filter 11. Input B of FIG. 1 would not be connected to a reference voltage. An output from amplitude detector 22 would provide 100 percent attenuation so that the mute amplifier 13 would produce no output.

Figure 4:
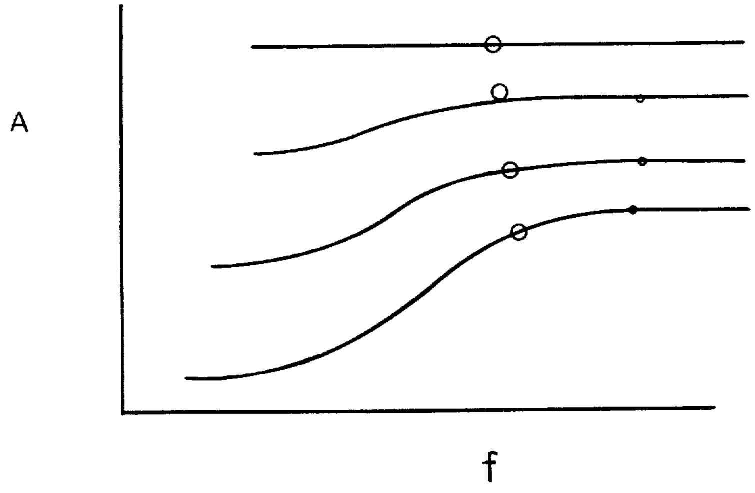
FIG. 4 is a set of characteristic curves useful in understanding the application of the embodiment of FIG. 2 as used in FIG. 3.
Figure 5:
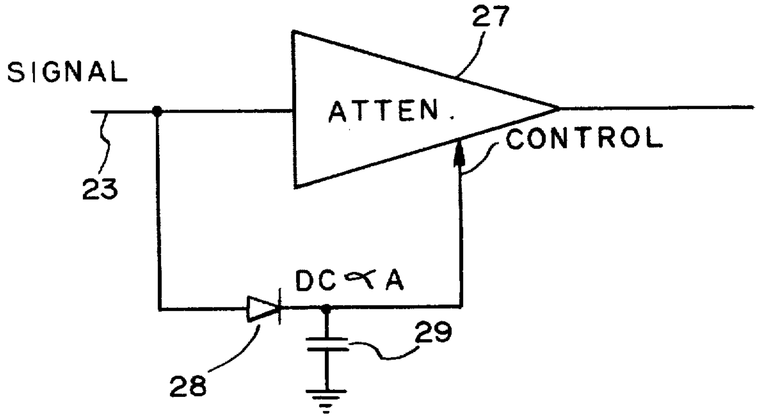
FIG. 5 is a block circuit diagram which as in FIG. 4 is useful in understanding the application of the embodiment of FIG. 2 and in FIG. 3.

The circuit of FIG. 2 is used in the expander 24. Such expander operates on a characteristic as illustrated in FIG. 4 which plots frequency against amplitude. The attenuator 27 as illustrated in FIG. 5 is coupled to the output of the phase locked loop on line 23. The control input to attenuator 27 would be coupled to either the C or D terminal of the attenuator. Such control input is provided a control voltage by means of a rectifier 28 and capacitor 29 which provides a dc control voltage proportional to the amplitude of the signal on line 23. This serves to smooth out the characteristic as illustrated in FIG. 4. In the specific embodiment as illustrated in FIG. 5 the attenuator 27 would have only its A input terminal connected.

With the foregoing circuit, a large attenuation of analog signals is provided with low distortion over a large operating range. In addition, there is no dc offset voltage.

I claim:

1. An integrated direct coupled electronic attenuator circuit comprising: first and second differential amplifiers each including a pair of transistors and each transistor having an input control terminal and first and second output terminals, said first output terminals of each pair of transistors being tied together at least one of said input control terminals receiving an ac input signal; a common constant current source, first and second switching means for coupling said constant current source to said tied pairs of said first output terminals, said switching means including means for selectively controlling the partitioning of said constant current between said first and second differential amplifiers; and load means coupled to the second output terminals of said differential amplifiers for concurrently receiving current from said constant current source which has been conducted through both said first and second differential amplifiers.

2. A circuit as in claim 1 where said load means include first and second transistors coupled together, such first transistor being connected to the second output terminals of both of said first transistors of said differential amplifiers and such second transistor being connected to the second output terminals of said second transistors of said differential amplifiers.

3. A circuit as in claim 2 where said load means includes a third transistor connected to said first transistor of said load means in a current multiplier configuration.

4. A circuit as in claim 1 where said load means includes a first pair of transistors coupling said first differential amplifier pair of transistors to a dc potential source, a second pair of transistors coupling said second differential amplifier pair of transistors to said dc potential source, and a third pair of transistors connected to ground through an output load resistor and to said dc potential source, all of the base inputs of said three pairs of transistors being connected in common.

* * * * *